United States Patent [19]

Mitani

[11] Patent Number: 5,757,694
[45] Date of Patent: May 26, 1998

[54] BALANCED RESISTANCE LOAD TYPE SRAM CELL

[75] Inventor: Hitoshi Mitani, Tokyo, Japan

[73] Assignee: NEC Corporation, Japan

[21] Appl. No.: 620,789

[22] Filed: Mar. 28, 1996

[30] Foreign Application Priority Data

Mar. 30, 1995 [JP] Japan ............... 7-098033

[51] Int. Cl.$^6$ ........................ G11C 11/00
[52] U.S. Cl. ............... 365/154; 365/156; 365/174; 257/903
[58] Field of Search ................... 365/154, 156, 365/174; 257/903

[56] References Cited

U.S. PATENT DOCUMENTS

| | | | |
|---|---|---|---|
| 4,125,954 | 11/1978 | McKenny et al. | 365/174 |
| 4,541,006 | 9/1985 | Ariizumi et al. | 365/154 |
| 4,768,172 | 8/1988 | Sasaki | 365/154 |
| 5,365,435 | 11/1994 | Matsumura et al. | 365/154 |

FOREIGN PATENT DOCUMENTS

| | | |
|---|---|---|
| A-63-29573 | 2/1988 | Japan. |
| 1-124250 | 5/1989 | Japan. |
| A-1-227469 | 11/1989 | Japan. |
| 3-157966 | 7/1991 | Japan. |
| A-4-17366 | 1/1992 | Japan. |
| 5-291535 | 11/1993 | Japan. |

*Primary Examiner*—David C. Nelms
*Assistant Examiner*—Hoai V. Ho
*Attorney, Agent, or Firm*—Hayes, Soloway, Hennessey, Grossman & Hage, P.C.

[57] ABSTRACT

In a static semiconductor memory device including first and second power supply lines for a first voltage, a third power supply line for a second voltage, first and second nodes, and first and second drive transistors connected between the first and second nodes and the third power supply line, a first load resistor is connected between the first power supply line and the first node, and a second load resistor is connected between the second power supply line and the second node.

3 Claims, 16 Drawing Sheets

▨ N-TYPE IMPURITY DIFFUSION
   REGIONS 5 & 7

BALANCED RESISTANCE LOAD TYPE SRAM CELL

BACKGROUND OF THE INVENTION

1. Field of the Invention

The present invention relates to a resistance load type static random access memory (SRAM) device.

2. Description of the Related Art

A prior art SRAM cell is constructed by a flip-flop formed by cross-coupled first and second inverters and transfer gates connected to first and second nodes of the flip-flop. That is, the first inverter is formed by a first resistance element between a high power supply line and the first node and a first drive MOS transistor between the first node and a ground line. Similarly, the second inverter is formed by a second resistance element between the high power supply line and the second node and a second drive MOS transistor between the second node and the ground line.

Also, the first node is connected directly to a gate electrode of the second drive transistor, so that the second drive transistor is driven directly by the voltage at the first node. Similarly, the second node is connected directly to a gate electrode of the first drive transistor, so that the first drive transistor is driven directly by the voltage at the second node.

In the above-described prior art SRAM cell, however, the first and second resistance elements are made of the same conductive layer which is connected at a point of the high power supply line. Therefore, the resistance values of the first and second resistance elements are unbalanced, so that data retention characteristics are deteriorated. Further, the prior art SRAM cell is subject to soft errors caused by α rays. That is, the first and second nodes are constructed by impurity diffusion regions in a semiconductor substrate. Therefore, when α rays penetrate into the first and second nodes or neighboring regions, the voltages at the first and second nodes fluctuate. If the resistance values of the first and second resistance elements are unbalanced, the voltages at the first and second nodes fluctuate further. As a result, operation states of the first and second drive transistors may be reversed.

The prior art SAM cell will be explained later in detail.

SUMMARY OF THE INVENTION

It is an object of the present invention to improve the data retention soft error resistance characteristics of a resistance load type static semiconductor memory device.

According to the present invention, in a static semiconductor memory device including first and second power supply lines for a first voltage, a third power supply line for a second voltage, first and second nodes, and first and second drive transistors connected between the first and second nodes and the third power supply line, a first load resistor is connected between the first power supply line and the first node, and a second load resistor is connected between the second power supply line and the second node.

Since the first and second load resistors are connected separately to the first and second power supply lines, the resistance values of the first and second load resistors can be balanced.

BRIEF DESCRIPTION OF THE DRAWINGS

The present invention will be more clearly understood form the description as set forth below, as compared with the prior art, with reference to the accompanying drawings, wherein.

DESCRIPTION OF THE PREFERRED EMBODIMENTS

Before presenting the description of the preferred embodiments of the present invention a prior art SRAM cell will be explained with reference to FIGS. 1, 2A, 2B, 2C, 3A, 3B, 4A, 4B and 4C.

Figure 1:
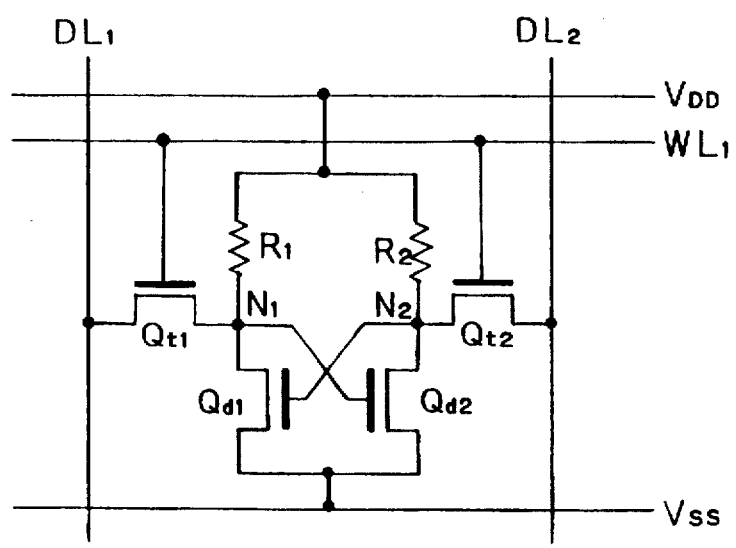
FIG. 1 is an equivalent circuit diagram illustrating a prior art SRAM cell.

In FIG. 1, which is an equivalent circuit diagram illustrating the prior art SRAM cell, one SRAM cell is provided at each intersection between a word line $WL_1$ and two complementary data lines $DL_1$ and $DL_2$. This memory cell is constructed by a flip-flop formed by two cross-coupled inverters and transfer N-channel MOS transistors $Q_{t1}$ and $Q_{t2}$ connected between nodes $N_1$ and $N_2$ of the flip-flop and the data lines $DL_1$ and $DL_2$.

The transfer transistors $Q_{t1}$ and $Q_{t2}$ are controlled by the voltage at the word line $WL_1$.

Each of the inverters includes a load resistor $R_1$ ($R_2$) and a drive N-channel MOS transistor $Q_{d1}$ ($Q_{d2}$) between a high power supply line $V_{DD}$ and a low power supply (ground) line $V_{SS}$. Node $N_1$ is connected to a gate of the drive transistor $Q_{d2}$, so that the drive transistor $Q_{d2}$ is driven by the voltage at node $N_1$. Also, node $N_2$ is connected to a gate of the drive transistor $Q_{d1}$, so that the drive transistor $Q_{d1}$ is driven by the voltage at node $N_2$.

Generally, transistors $Q_{t1}$, $Q_{t2}$, $Q_{d1}$ and $Q_{d2}$ are formed on a principal surface of a semiconductor substrate, and the load resistors $R_1$ and $R_2$ are made of polycrystalline silicon or semi-insulated polycrystalline silicon (SIPOS).

As SRAM cells become more refined, load resistors $R_1$ and $R_2$ have to be more highly stable.

Figure 2A:
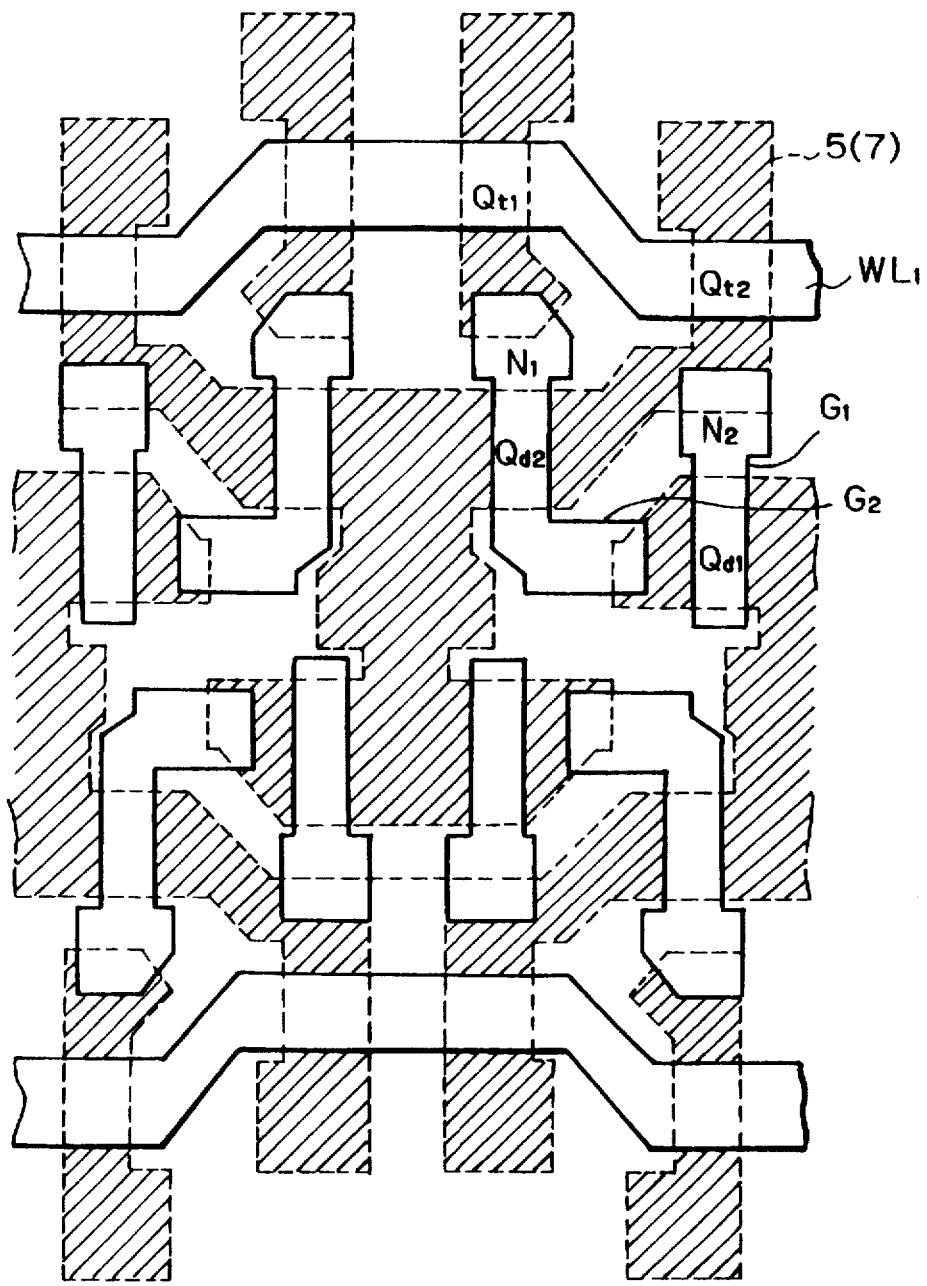
FIGS. 2A, 3A and 4A are plan views for explaining a method for manufacturing the SRAM cell of FIG. 1.
Figure 2B:
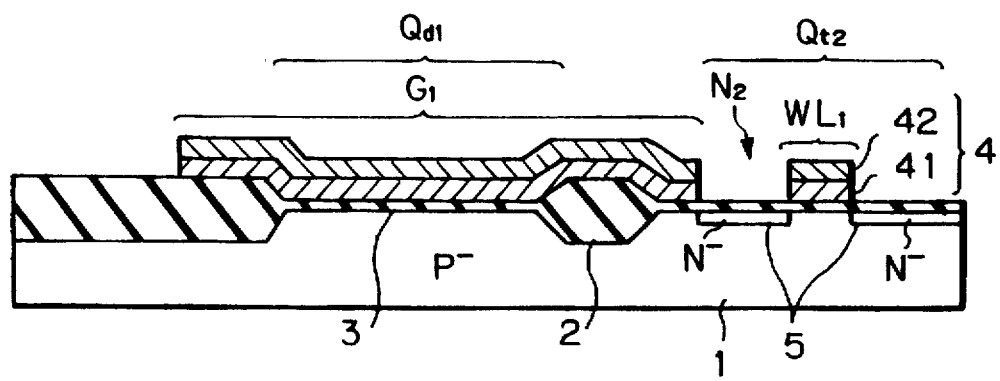
FIGS. 2B and 2C are cross-sectional views of the transfer transistor and the drive transistor of FIG. 2A.
Figure 2C:
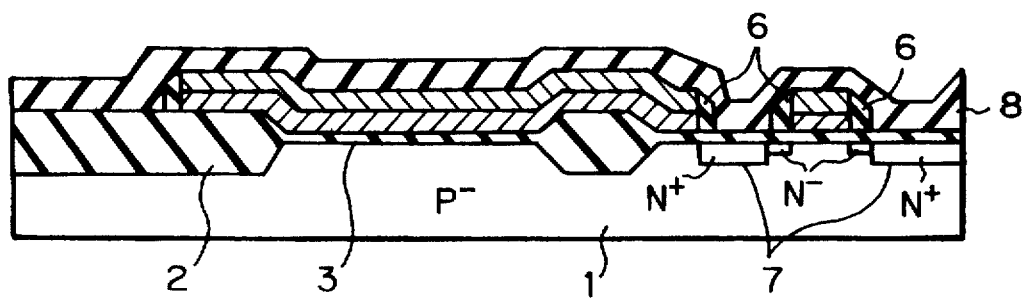
Figure 3A:
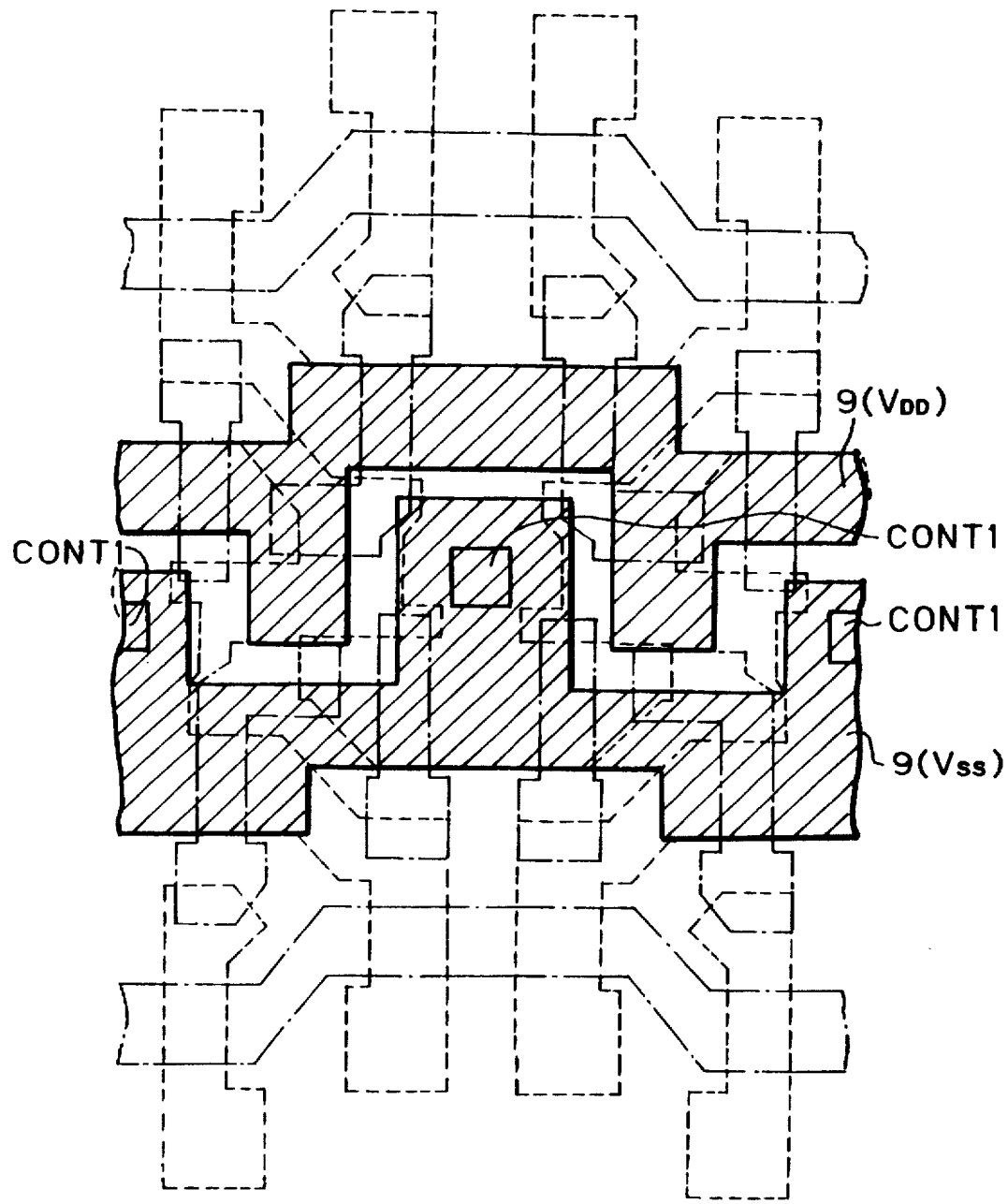

The structure of the SRAM cell of FIG. 1 is explained next with reference to FIGS. 2A, 2B, 2C, 3A, 3B, 4A, 4B and 4C which show manufacturing steps thereof. Note that FIGS. 2A, 3A and 4A are plan views of four-bit SRAM cells; FIGS. 2B and 2C are cross-sectional views of the transfer transistor $Q_{t2}$ and the drive transistor $Q_{d1}$ of FIG. 2A; FIG.

Figure 4A:
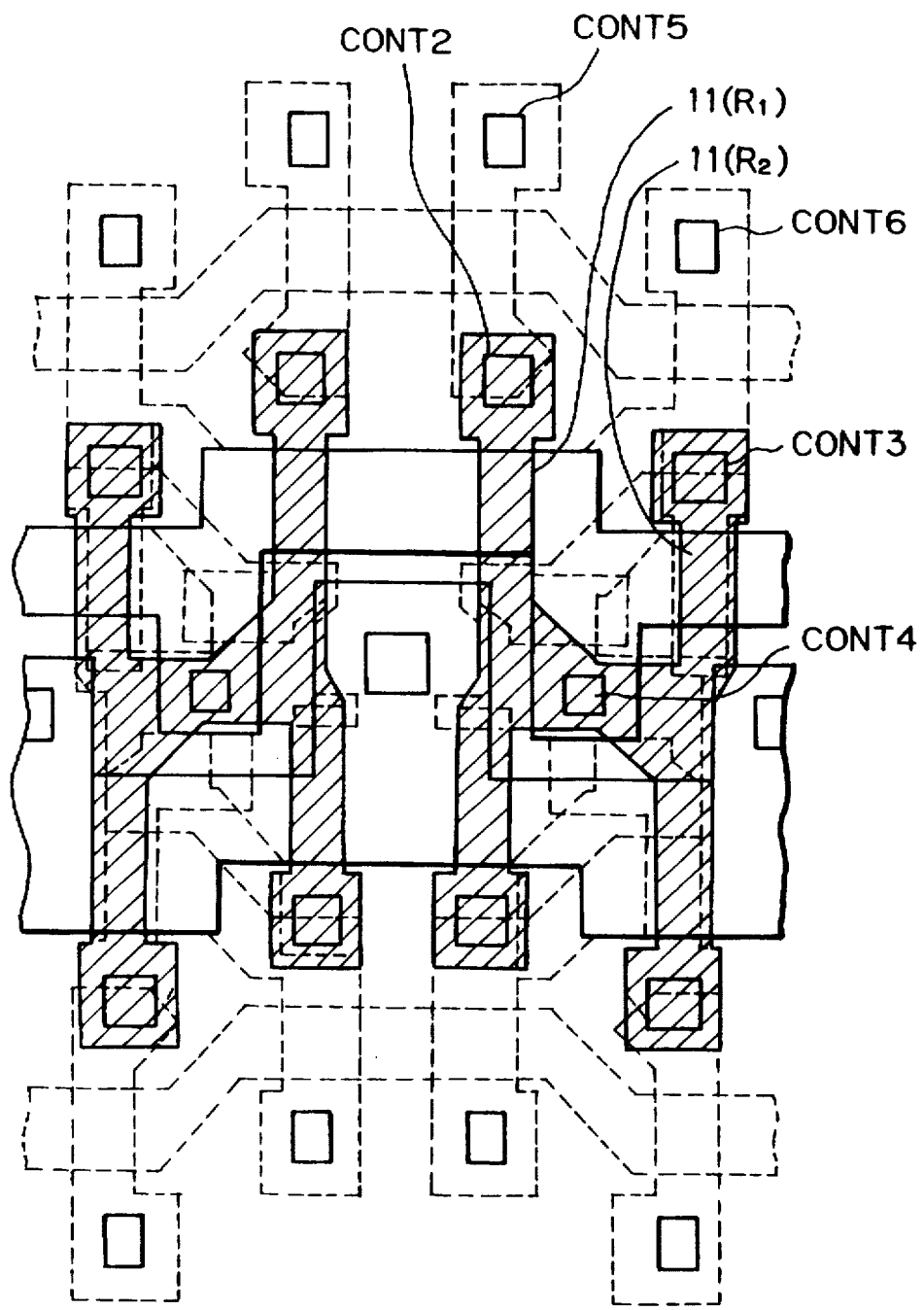
Figure 4B:
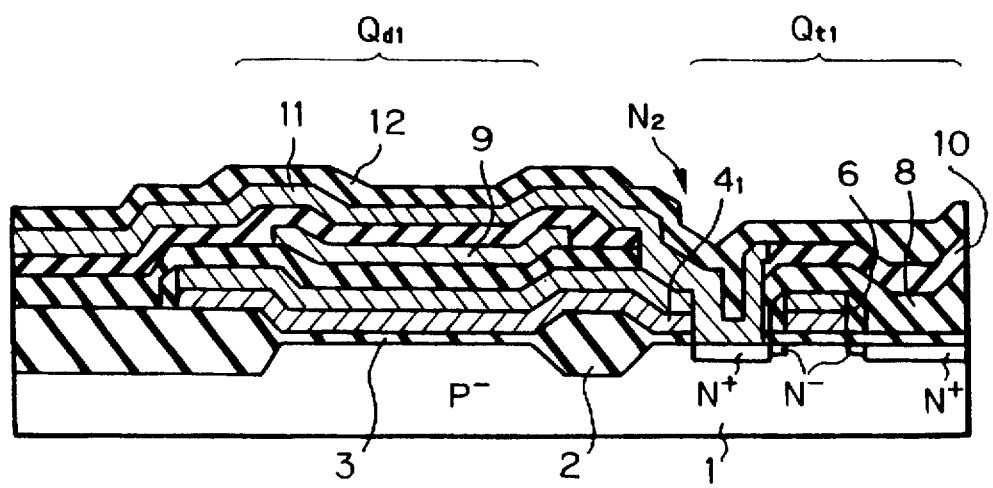
FIGS. 4B and 4C are cross-sectional views of the transfer transistor and the drive transistor of FIG. 4A.
Figure 4C:
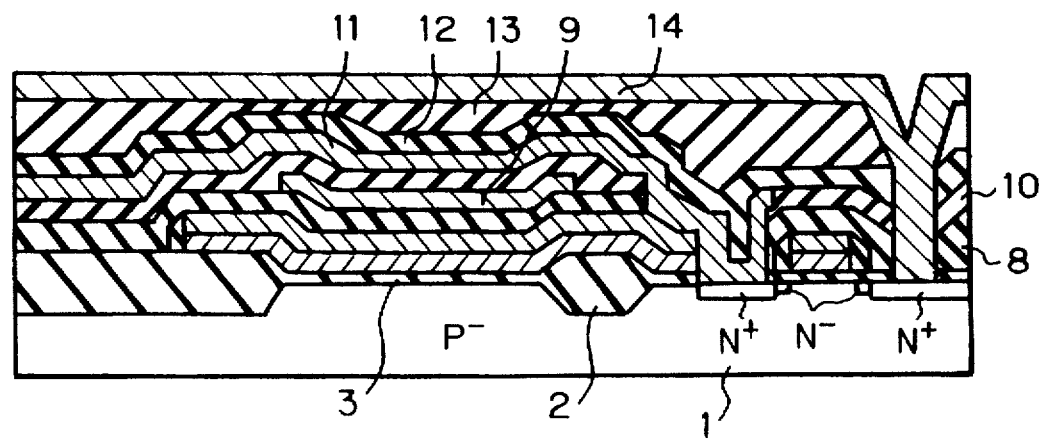

3B is a cross-sectional view of the transfer transistor $Q_t^1$ and the drive transistor $Q_d^1$ of FIG. 3A; and FIGS. 4B and 4C are cross-sectional views of the transfer transistor $Q_t^1$ and the drive transistor $Q_d^1$ of FIG. 4A.

First, referring to FIGS. 2A and 2B, a p⁻-type monocrystalline silicon substrate 1 is thermally oxidized to form a field silicon oxide layer 2 by using a local oxidation of silicon (LOCOS) process. Thereafter, a gate silicon oxide layer 3 is formed by thermally oxidizing the substrate 1. Then, a gate electrode 4, including a polycrystalline silicon layer 41 and a tungsten layer 42, is formed on the gate silicon oxide layer 3 and the field silicon oxide layer 2. Then, phosphorous ions are implanted into the substrate 1 using the gate electrode 4 as a mask to form N⁻-type impurity diffusion regions 5 of a lightly-doped drain (LDD) configuration.

Next, referring to FIGS. 2A and 2C, a silicon oxide layer is formed on the entire surface, and an isotropic etching operation is performed upon the silicon oxide layer to form sidewall silicon oxide layers 6. Then, arsenic ions are implanted into the substrate 1 using the sidewall silicon oxide layers 6 as a mask to form N⁺-type impurity diffusion regions 7 of the LDD configurations Then, a silicon oxide layer 8 is formed on the entire surface by using a chemical vapor deposition (CVD) process.

In FIG. 2A, only word lines such as $WL_1$ and conductive layers such as $G_1$ and $G_2$ formed by the gate electrode 4, and the N-type impurity diffusion regions 5 and 7 of FIGS. 2B and 2C are illustrated; the other portions are omitted. Note that word line $WL_1$ serves as gate electrodes of transfer transistors $Q_t^1$ and $Q_t^2$, conductive layer $G_1$ serves as a gate of drive transistor $Q_d^1$, and conductive layer $G_2$ serves as a gate of drive transistor $Q_d^2$.

Figure 3B:
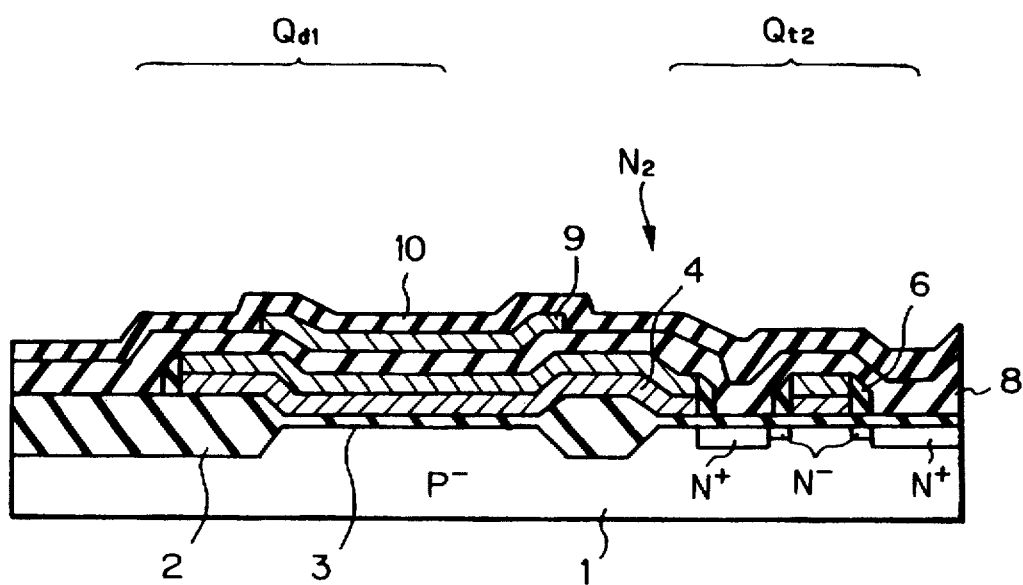
FIG. 3B is a cross-sectional view of the transfer transistor and the drive transistor of FIG. 3A.

Next, referring to FIGS. 3A and 3B, a tungsten layer 9 is formed and is patterned to form high power supply line $V_{DD}$ and low power supply line $V_{SS}$. In this case, low power supply line $V_{SS}$ is connected via contact holes CONT1 to sources (the N⁺-type impurity regions 7) of drive transistors $Q_d^1$ and $Q_d^2$. Then, a silicon oxide layer 10 is formed on the entire surface by using a CVD process.

Next, referring to FIGS. 4A and 4B, contact holes CONT2, CONT3 and CONT4 are perforated in the silicon oxide layer 10 and the like. Then, an SIPOS layer 11 is formed and is patterned. As a result, at node $N_1$ i.e., contact hole CONT2, the SIPOS layer 11 is connected to the gate of the drive transistor $Q_d^2$ and the source of transfer transistor $Q_t^1$. Also, at the node $N_2$ i.e., the contact hole CONT3R the SIPOS layer 11 is connected to the gate of the drive transistor $Q_d^1$ and the source of the transfer transistor $Q_t^2$. Further, at contact hole CONT4, the SIPOS layer 11 is connected to the high power supply line $V_{DD}$. Thus, the SIPOS layer 11 serves as the load resistors $R_1$ and $R_2$.

Finally, referring to FIGS. 4A and 4C, a silicon oxide layer 13 is formed on the entire surface, and is flattened. Then, contact holes CONT5 and CONT6 are perforated in the silicon oxide layer 13 and the like. Then, an aluminum layer 14 is formed and is patterned to form the data lines $DL_1$ and $DL_2$. In this case, data line $DL_1$ is connected via contact hole CONT5 to the drain of the transfer transistor $Q_t^1$, and the data line $DL_2$ is connected via contact hole CONT6 to the drain of the transfer transistor $Q_t^2$.

Regarding the above-described prior art SRAM cell, reference is made to JP-A-63-29573, JP-A-1-227469 and JP-A-4-17366.

In the above-described prior art SRAM cell, however, load resistor $R_1$ is not equivalent to load resistor $R_2$. That is, as illustrated in FIG. 4A, there is a large difference in length between load resistor $R_1$ (from CONT2 to CONT4) and the load resistor $R_2$ (from CONT3 to CONT4). For example, load resistor $R_1$ is longer, by about 10 percent, than load resistor $R_2$. As a result, the loads of the inverters of the flip-flop are unbalanced, which deteriorates data retention characteristics, soft error resistance (SER) characteristics and the like.

Note that reduction size of the memory cells decreases capacitance of the nodes, which thereby deteriorates soft error resistance characteristics. In the resistance load type SRAM cell, it is possible to improve soft error resistance characteristics by reducing resistance values of the loads; in this case, resistance values of the loads are greatly unbalanced as stated above, so that soft error resistance characteristics can be improved only to some extent.

Figure 5:
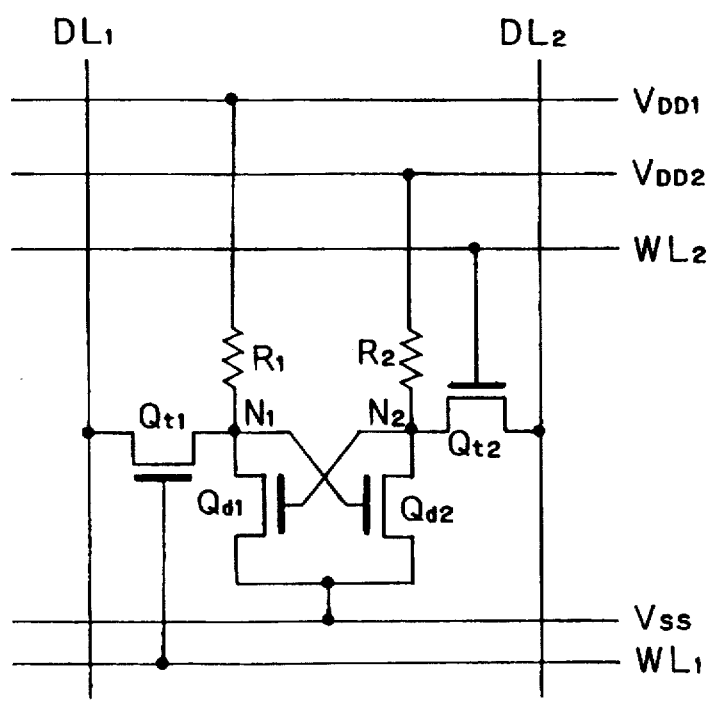
FIG. 5 is an equivalent circuit diagram illustrating an SEAM cell to which embodiments of the present invention are applied.

In FIG. 5, which is an equivalent circuit diagram illustrating a SRAM cell to which embodiments of the present invention are applied, a word line $WL_2$ is added to the elements of FIG. 1. That is, the gate of the transfer transistor $Q_t^1$ is controlled by the voltage at word line $WL_1$, and the gate of the transfer transistor $Q_t^2$ is controlled by the voltage at word line $WL_2$. In this case, note that the voltage at word line $WL_1$ is same as that at the word line $WL_2$. Also, two high power supply lines $V_{DD}^1$ and $V_{DD}^2$ are provided instead of the high power supply line $V_{DD}$ of FIG. 1. The high power supply lines $V_{DD}^1$ and $V_{DD}^2$ are connected to load resistors $R_1$ and $R_2$, respectively. In this case, note that voltage at the high power supply line $V_{DD}^1$ is the same as that at high power supply line $V_{DD}^2$.

Figure 6A:
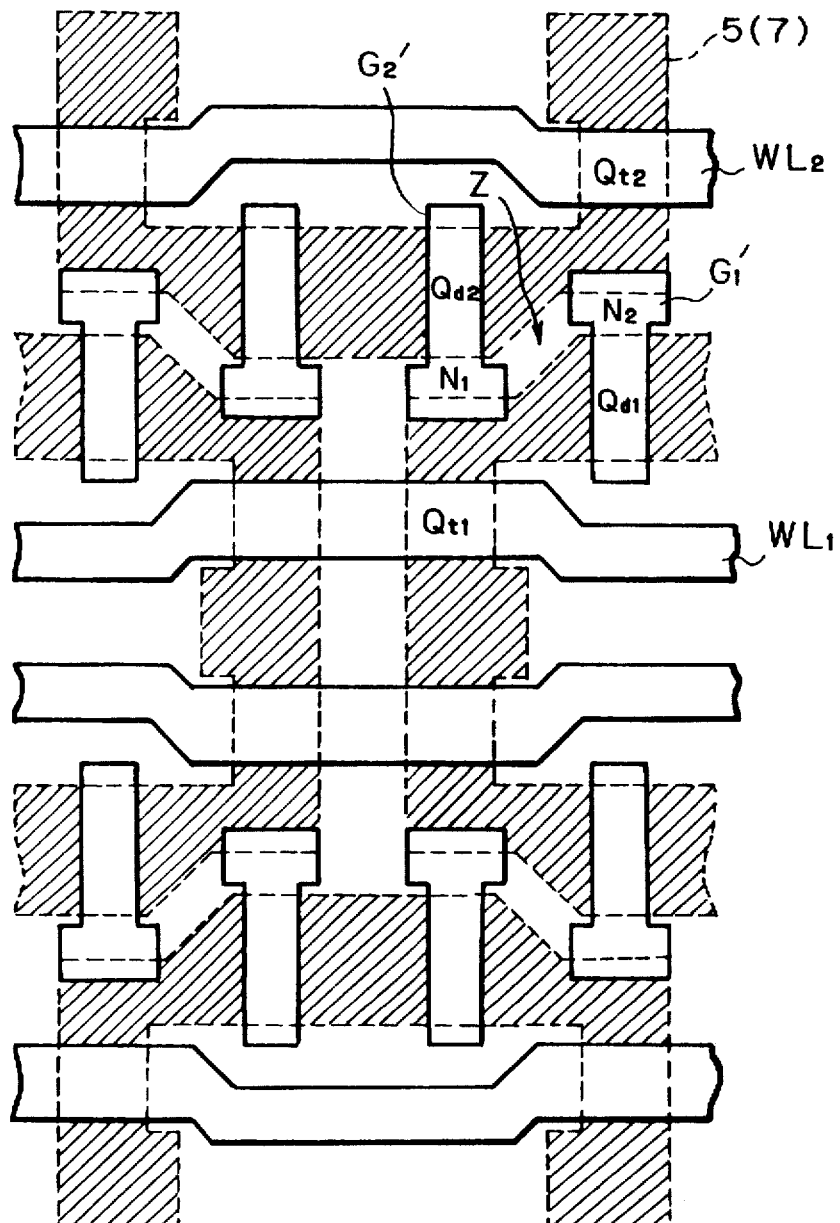
FIGS. 6A, 7A and 8A are plan views for explaining a method for manufacturing a first embodiment of the SRAM cell according to the present invention.
Figure 6B:
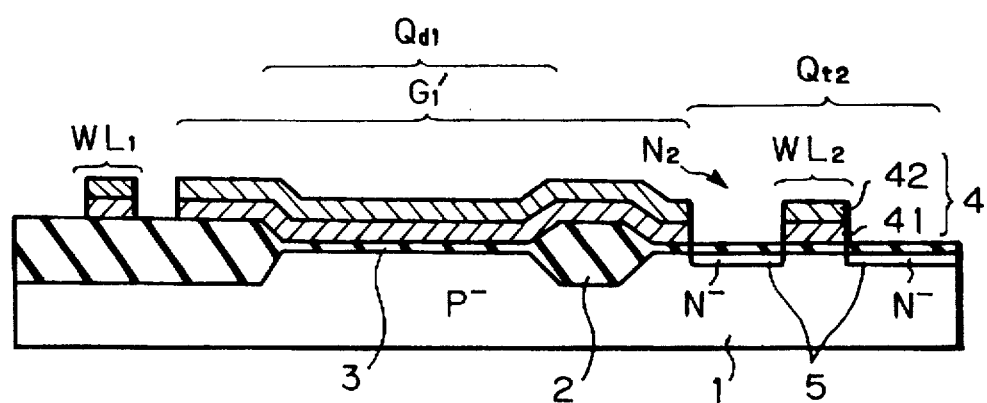
FIGS. 6B and 6C are cross-sectional views of the transfer transistor and the drive transistor of FIGS. 6A.
Figure 6C:
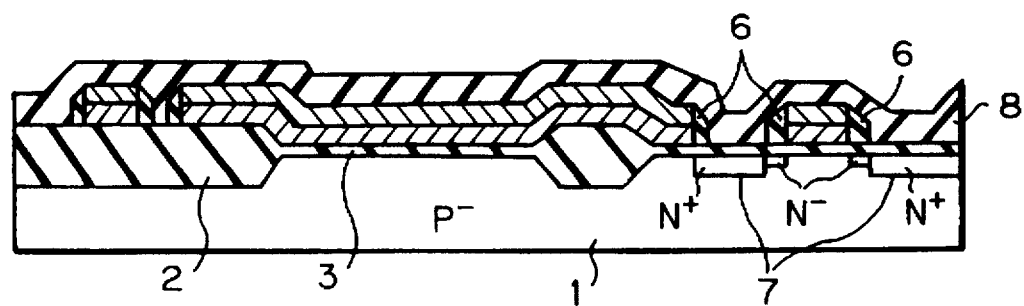
Figure 7A:
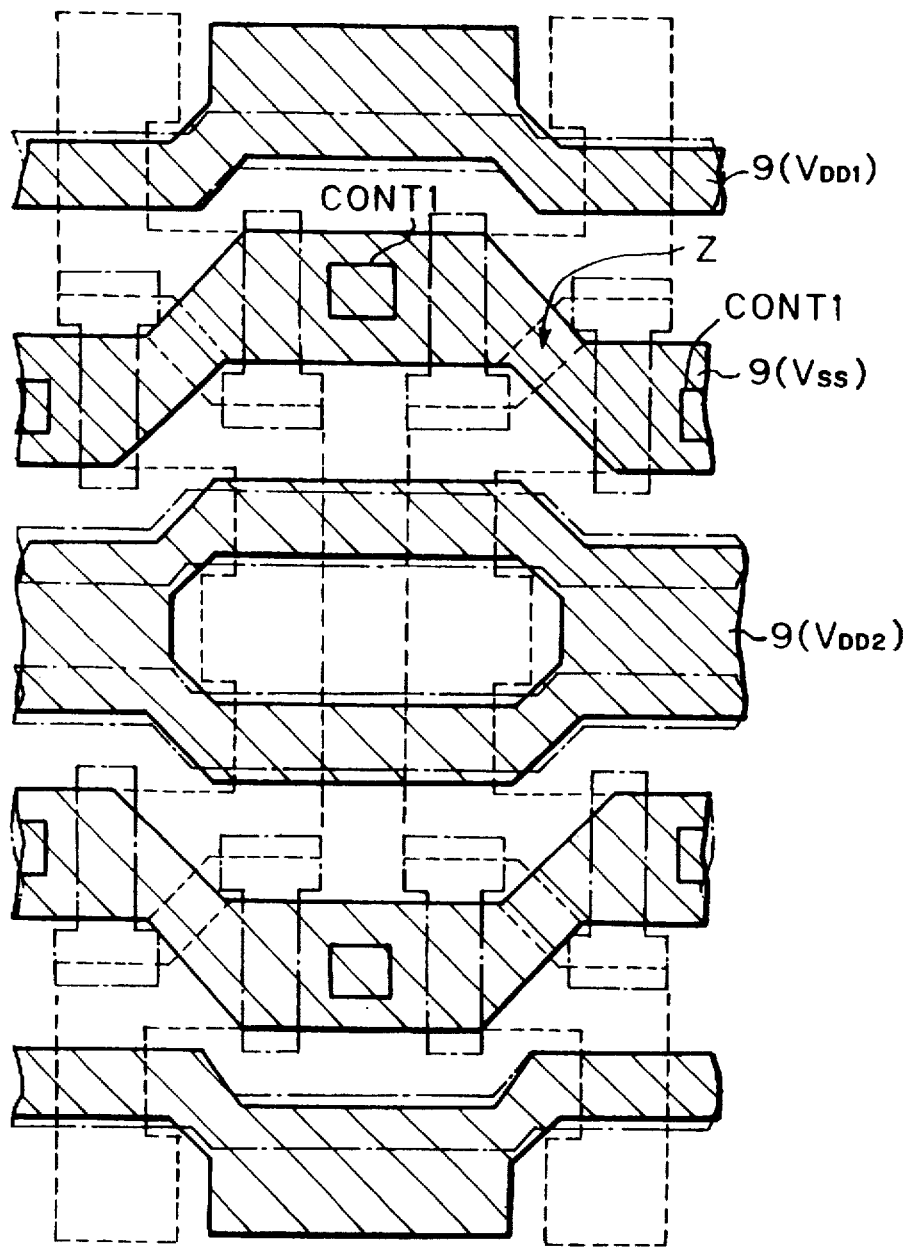
Figure 7B:
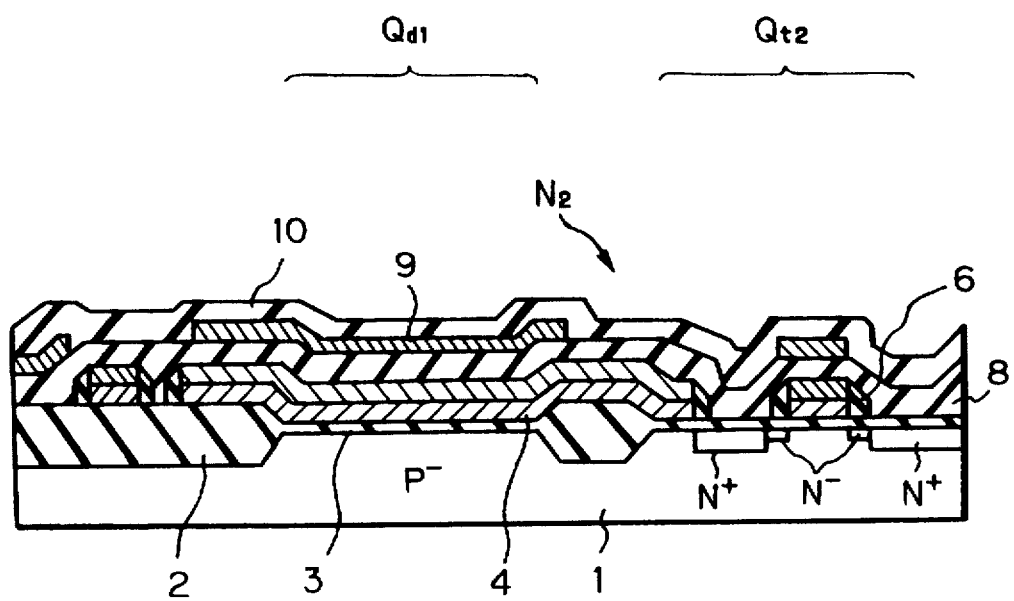
FIG. 7B is a cross-sectional view of the transfer transistor and the drive transistor of FIG. 7A.
Figure 8A:
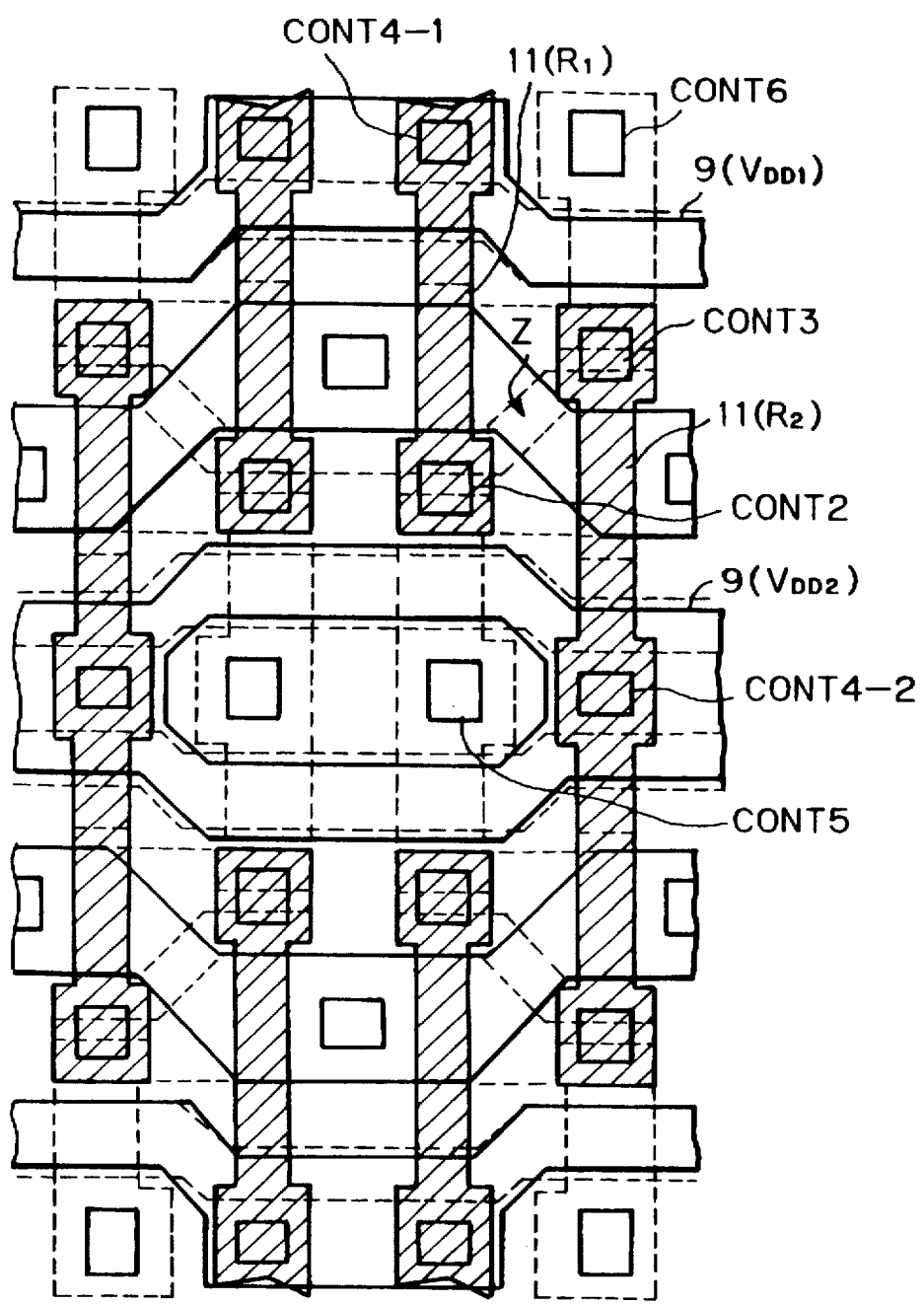
Figure 8B:
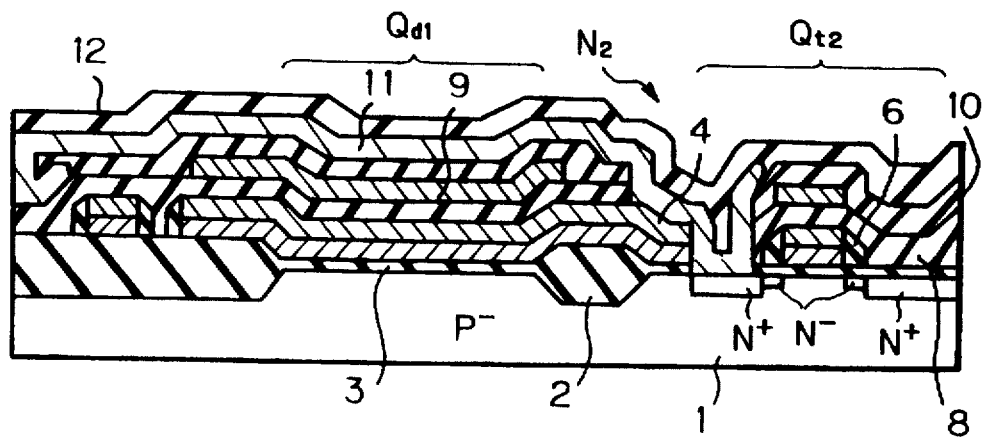
FIGS. 8B and 8C are cross-sectional views of the transfer transistor and the drive transistor of FIG. 8A;.
Figure 8C:
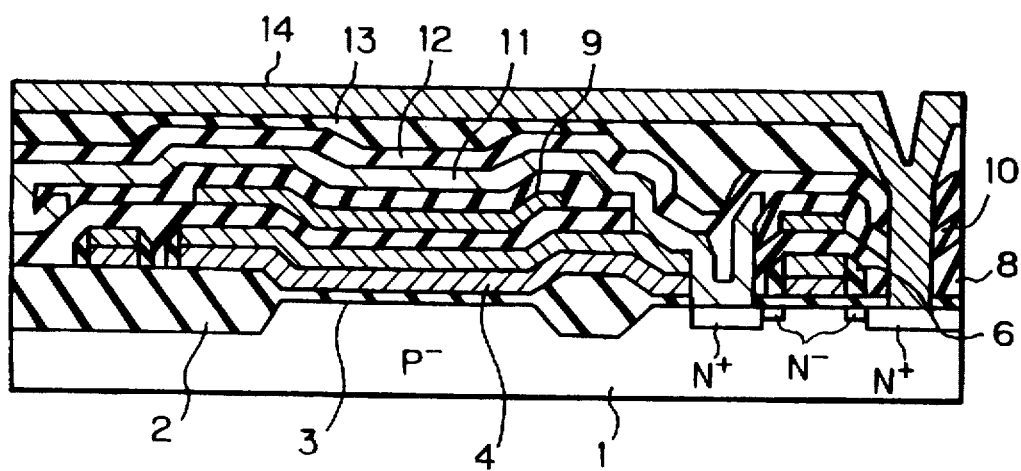

A first embodiment of the present invention is explained next with reference to FIGS. 6A, 6B, 6C, 7A, 7B, 8A and 8B which show manufacturing steps thereof. Note that FIGS. 6A, 7A and 8A are plan views of four-bit SRAM cells; FIGS. 6B and 6C are cross-sectional views of the transfer transistor $Q_t^1$ and the drive transistor $Q_d^1$ of FIG. 6A; FIG. 7B is a cross-sectional view of the transfer transistor $Q_t^1$ and drive transistor $Q_d^1$ of FIG. 7A; and FIGS. 8B and 8C are cross-sectional views of the transfer transistor $Q_t^1$ and drive transistor $Q_d^1$ of FIG. 8A.

First, referring to FIG. 6A and 6B, in a similar way to that shown in FIGS. 2A and 2B, a p⁻-type monocrystalline silicon substrate 1 is thermally oxidized to form LOCOS a field silicon oxide layer 2 by using a LOCOS process. Thereafter, a gate silicon oxide layer 3 is formed by thermally oxidizing the substrate 1. Then, a gate electrode 4, including an about 100 nm thick polycrystalline silicon layer 41 and an about 100 nm thick tungsten layer 42, is formed on the gate silicon oxide layer 3 and the field silicon oxide layer 2. Then, phosphorous ions are implanted into the substrate 1 using the gate electrode 4 as a mask to form N⁻-type impurity diffusion regions 5 of an LDD configuration.

Next, referring to FIG. 6A and 6C, in the same way as shown in FIGS. 2A and 2C, a silicon oxide layer is formed on the entire surface, and an isotropic etching operation is performed upon the silicon oxide layer to form sidewall silicon oxide layers 6. Then, arsenic ions are implanted into the substrate 1 using the sidewall silicon oxide layers 6 as a mask to form N⁺-type impurity diffusion regions 7 of the LDD configuration. Then, a silicon oxide layer 8 is formed on the entire surface by using a CVD process.

In FIG. 6A, only word lines such as $WL_1$ and $WL_2$ and conductive layers such as $G_1'$ and $G_2'$ formed by the gate electrode 4, and the N-type impurity diffusion regions 5 and 7 of FIGS. 6B and 6C are illustrated; the other portions are omitted. Note that word lines $WL_1$ and $WL_2$ serve as gate electrodes of the transfer transistors $Q_{t^1}$ and $Q_{t^2}$, respectively. Also, conductive layer $G_1'$ serves as a gate of the drive transistor $Q_{d^1}$, and conductive layer $G_2'$ serves as a gate of the drive transistor $Q_{d^2}$.

In FIG. 6A, the N-type impurity diffusion regions 5 and 7, word lines $WL_1$ and $WL_2$, and conductive layers $G_1'$ and $G_2'$ are symmetrical with respect to a center location thereof as indicated by Z.

Next, referring to FIGS. 7A and 7B, in a similar way to that shown in FIGS. 3A and 3B, a tungsten layer 9 is formed and is patterned to form the high power supply lines $V_{DD}^1$ and $V_{DD}^2$ and the low power supply line $V_{SS}$. In this case, the low power supply line $V_{SS}$ is connected via contact holes CONT1 to sources ($N^+$-type impurity regions 7) of the drive transistors $Q_{d^1}$ and $Q_{d^2}$. Then, a silicon oxide layer 10 is formed on the entire surface by using a CVD process.

In FIG. 7A, the high power supply lines $V_{DD}^1$ and $V_{DD}^2$ and the low power supply line $V_{SS}$ are symmetrical with respect to the center location thereof as indicated by Z.

Next, referring to FIGS. 6A and 8B, in a similar way to that shown in FIGS. 4A and 4B, contact holes CONT2, CONT3, CONT4-1 and CONT4-2 are perforated in the silicon oxide layer 10 and the like. Then, a SIPOS layer 11 is formed and is patterned. As a result, at node $N_1$ i.e., contact hole CONT2, SIPOS layer 11 is connected to gate of drive transistor $Q_{d^2}$ and the source of transfer transistor $Q_{t^1}$. Also, at node $N_2$, i.e., the contact hole CONT3, the SIPOS layer 11 is connected to the gate of the drive transistor $Q_{d^1}$ and the source of the transfer transistor $Q_{t^2}$. Further, SIPOS layer 11 is connected to the high power supply line $V_{DD}^1$ at the contact hole CONT4-1, and SIPOS layer 11 is connected to the high power supply line $V_{DD}^2$ at contact hole CONT4-2. Thus, SIPOS layer 11 serves as load resistors $R_1$ and $R_2$.

Finally, referring to FIGS. 8A and 8C, in a similar way to that shown in FIGS. 4A and 4C, a silicon oxide layer 13 is formed on the entire surface, and is flattened. Then, contact holes CONT5 and CONT6 are perforated in the silicon oxide layer 13 and the like. Then, an aluminum layer 14 is formed and is patterned to form data lines $DL_1$ and $DL_2$. In this case, data line $DL_1$ is connected via contact hole CONT5 to the drain of the transfer transistor $Q_{t^1}$, and data line DL2 is connected via contact hole CONT6 to the drain of the transfer transistor $Q_{t^2}$.

In FIG. 8A, load resistors $R_1$ and $R_2$ are symmetrical with respect to the center location thereof as indicated by Z.

In the first embodiment, since the high power supply lines $V_{DD}^1$ and $V_{DD}^2$ are provided for load resistors $R_1$ and $R_2$, respectively, the resistance values of load resistors $R_1$ and $R_2$ can be easily adjusted. Therefore, the load resistors $R_1$ and $R_2$ maybe so balanced that there maybe substantially no difference in resistance between them.

Figure 9A:
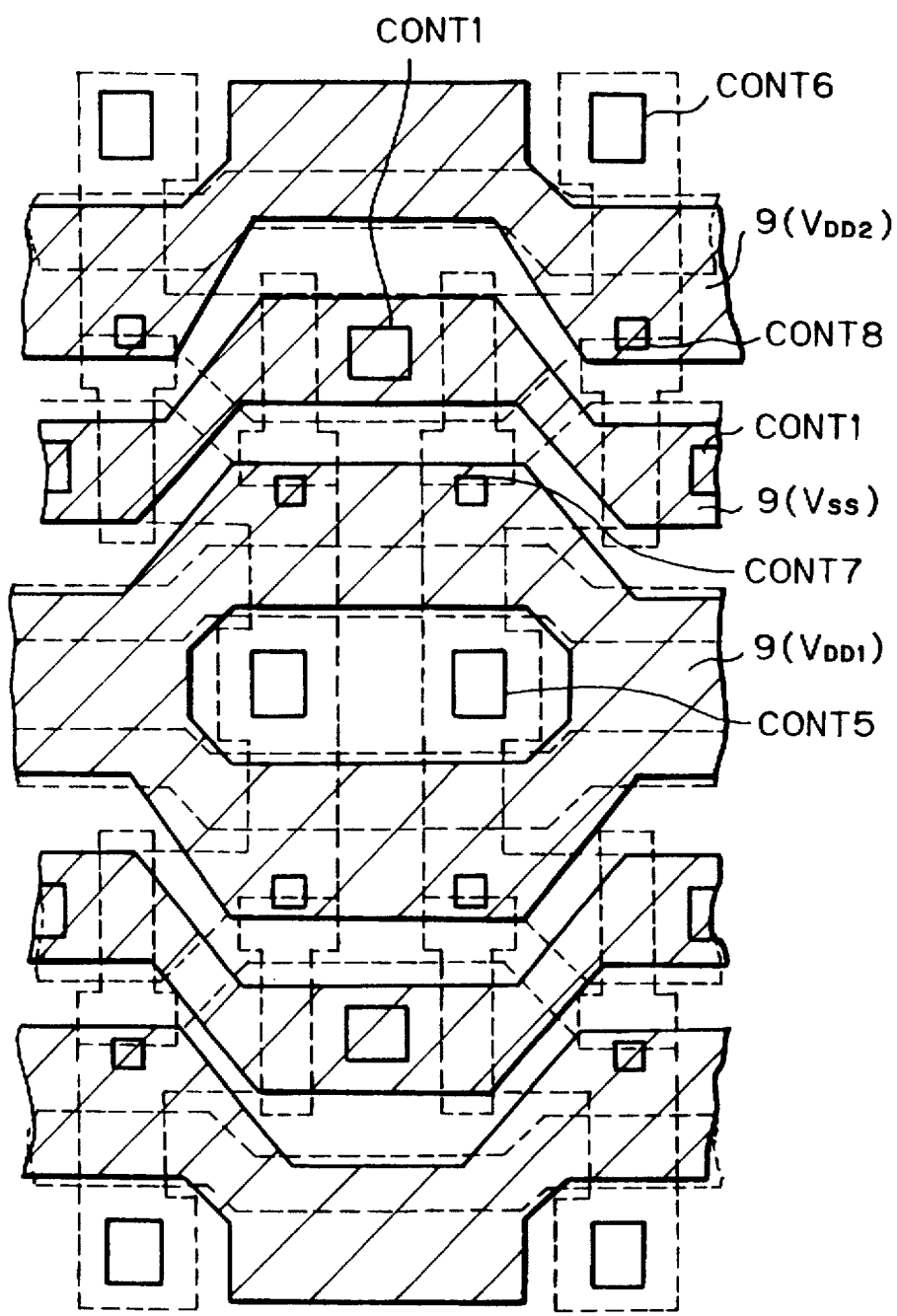
FIG. 9A is a plan view for explaining a method for manufacturing a second embodiment of the SRAM cell according to the present invention.
Figure 9B:
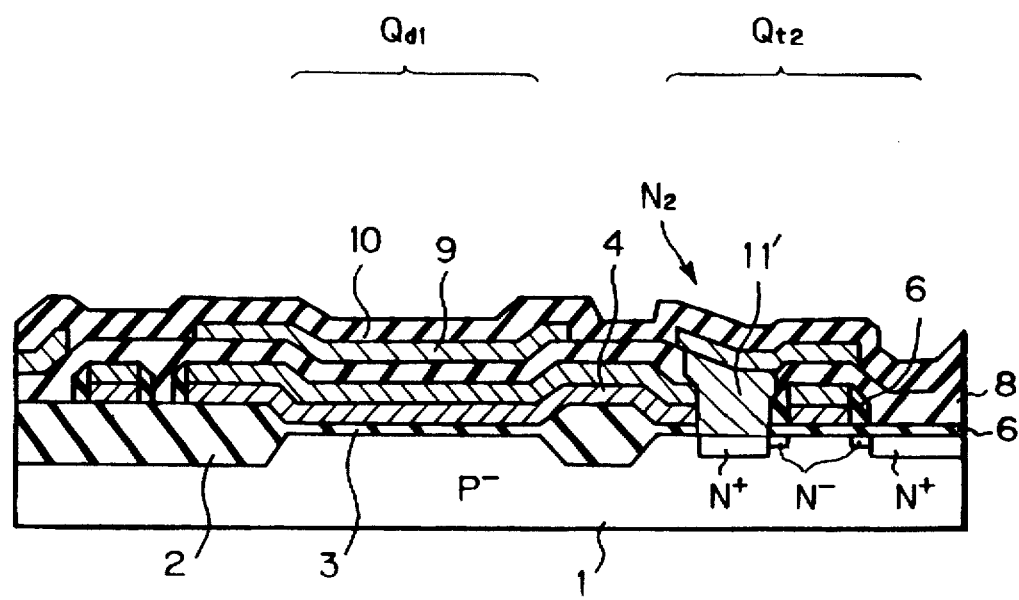
FIG. 9B is a cross-sectional view of the transfer transistor and the drive transistor of FIG. 9A.

A second embodiment of the present invention is explained next with reference to FIGS. 9A and 9B which correspond to FIGS. 7A and 7B, respectively. In FIGS. 9A and 9B, contact holes CONT7 and CONT8 are perforated in silicon oxide layer 8 and the like, and a SIPOS layer 11' is formed only within the contact holes CONT7 and CONT8. In this case, tungsten layer 9($V_{DD}^1$) covers the contact hole CONT7 and is in direct contact with SIPOS layer 11' within the contact hole CONT7. Also, tungsten layer 9 ($V_{DD}^2$) covers contact hole CONT8 and is in direct contact with SIPOS layer 11' within contact hole CONT8. Thus, SIPOS layer 11' serves as load resistors $R_1$ and $R_2$.

In the second embodiment, since resistance values of load resistors $R_1$ and $R_2$ are determined by the sizes of the contact holes CONT7 and CONT8, resistance values of load resistors $R_1$ and $R_2$ can be easily adjusted. Therefore, load resistors $R_1$ and $R_2$ maybe so balanced that there maybe substantially no difference in resistance between them.

As explained hereinbefore, according to the present invention, since the imbalance of the load resistors of a SRAM cell can be substantially eliminated, data retention and soft error resistance characteristics can be improved.

I claim:

1. A static memory cell formed in cell region, said static memory cell comprising:

a first power supply line for a first power voltage;

a second power supply line for said first power voltage;

a third power supply line for a second power voltage;

a first load resistor connected between said first power supply line and a first node;

a second load resistor connected between said second power supply line and a second node;

a first drive transistor connected between said first node and said third power supply line and having a gate connected to said second node;

a second drive transistor connected between said second node and said third power supply line and having a gate connected to said first node;

a first transfer transistor connected between said first node and a third node and having a gate connected to a first word line; and a second transfer transistor connected between second node and a fourth node and having a gate connected to a second word line, said first and second word lines being at the same voltage level, said third power supply line crossing over said cell region to divide said cell region into a first area on a first side of said third power supply line and a second area on a second side of said third power supply line, said first power supply line and said second word line being formed over said first area, said second power supply line and said first word line being formed over said second area;

wherein said first and second power supply lines, respectively, and said third power supply line are symmetrically disposed with respect to a center of said cell region.

2. The device as set forth in claim 1, wherein said first and second load resistors, respectively, said first and second drive transistors, respectively, and said first and second transistors, respectively, are symmetrically disposed with respect to said center of said cell region.

3. The device as set forth in claim 1, wherein each of said first and second load resistors comprises a high resistance element filled in a contact hole area formed in said first and second nodes, respectively.

* * * * *